(12) United States Patent
Wang

(10) Patent No.: US 9,825,069 B2
(45) Date of Patent: Nov. 21, 2017

(54) ARRAY SUBSTRATE MANUFACTURING METHOD

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Kai Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/767,132

(22) PCT Filed: Oct. 14, 2014

(86) PCT No.: PCT/CN2014/088589
§ 371 (c)(1),
(2) Date: Aug. 11, 2015

(87) PCT Pub. No.: WO2016/004692
PCT Pub. Date: Jan. 14, 2016

(65) Prior Publication Data
US 2016/0247828 A1    Aug. 25, 2016

(30) Foreign Application Priority Data
Jul. 11, 2014    (CN) .......................... 2014 1 0331516

(51) Int. Cl.
*H01L 21/00*    (2006.01)
*H01L 27/12*    (2006.01)
(Continued)

(52) U.S. Cl.
CPC ........ *H01L 27/127* (2013.01); *H01L 27/1225* (2013.01); *H01L 27/1288* (2013.01);
(Continued)

(58) Field of Classification Search
CPC ........... H01L 27/3262; H01L 29/42384; H01L 27/127; H01L 27/1225; H01L 27/1288;
(Continued)

(56) References Cited

U.S. PATENT DOCUMENTS

2015/0340504 A1* 11/2015 Choi .................. H01L 29/41733
257/43
2015/0348996 A1* 12/2015 Qin ..................... H01L 27/1214
257/43

FOREIGN PATENT DOCUMENTS

CN    101572274 A    11/2009
CN    102637648 A    8/2012
(Continued)

OTHER PUBLICATIONS

International Search Report Appln. No. PCT/CN2014/088589; dated Apr. 22, 2015.
(Continued)

*Primary Examiner* — Richard Booth
(74) *Attorney, Agent, or Firm* — Ladas & Parry LLP

(57) ABSTRACT

An array substrate manufacturing method, including: forming an active layer of a thin film transistor, in which photoresist with a partial thickness at a location corresponding to a channel area between source/drain electrodes of the thin film transistor on the active layer is reserved; forming a source/drain metal layer, and further forming source/drain electrodes; lifting off the photoresist with the partial thickness on the channel area between the source/drain electrodes. The array substrate manufacturing method can avoid damaging the metal oxide layer in the etching process for
(Continued)

source/drain electrodes, and lower production cost, simplify processes, and increase yield and product profit.

18 Claims, 2 Drawing Sheets

(51) Int. Cl.
  *H01L 29/49* (2006.01)
  *H01L 29/786* (2006.01)
  *H01L 29/66* (2006.01)

(52) U.S. Cl.
  CPC ...... *H01L 29/495* (2013.01); *H01L 29/66969* (2013.01); *H01L 29/7869* (2013.01)

(58) Field of Classification Search
  CPC ............... H01L 29/495; H01L 29/7869; H01L 29/66969
  See application file for complete search history.

(56) References Cited

FOREIGN PATENT DOCUMENTS

| CN | 102693938 A | 9/2012 |
|---|---|---|
| CN | 103545378 A | 1/2014 |
| CN | 103915379 A | 7/2014 |
| CN | 104091784 A | 10/2014 |

OTHER PUBLICATIONS

Written Opinion of the International Searching Authority Appln. No. PCT/CN2014/088589; dated Apr. 22, 2015.
First Chinese Office Action Appln. No. 201410331516.4; dated Aug. 5, 2015.
Second Chinese Office Acton dated Jan. 28, 2016; Appln. No. 201410331516.4.
Third Chinese Office Action dated Jun. 14, 2016; Appln. No. 201410331516.4.
Fourth Chinese Office Action dated Nov. 9, 2016; Appln. No. 201410331516.4 .

* cited by examiner

ARRAY SUBSTRATE MANUFACTURING METHOD

TECHNICAL FIELD

Embodiments of the invention relate to an array substrate manufacturing method.

BACKGROUND

In recent years, the sizes of liquid crystal displays continue to increase, and the frequency of a display drive circuit is increased as well. The mobility of amorphous silicon thin film transistors (TFTs) is about 0.5 cmW·S. When the size of a liquid crystal display is over 80 inches and the drive frequency is 120 Hz, the mobility of the TFTs used in the liquid crystal display is required to be above 1 cmW·S. Therefore, the mobility of amorphous silicon TFTs fails to meet the requirement obviously. Thin film transistors with high mobility comprise polysilicon thin film transistors and metal oxide thin film transistors. However, polysilicon thin film transistors suffer poor uniformity in manufacturing, and the manufacturing process is sophisticated. Indium gallium zinc oxide thin film transistors (IGZO-TFTs) possess high mobility, good uniformity, transparency, and simple manufacturing process, and can meet the demand for a large-sized liquid crystal display and for active organic electroluminescent.

The structures of current metal oxide IGZO-TFTs mainly involve three types: an etching barrier type, a back channel etching type, and a coplanar type.

The metal oxide IGZO-TFT of the etching barrier type has a simple manufacturing process. The etching barrier layer on the metal oxide IGZO layer can protect the metal oxide IGZO layer from being damaged when source/drain metal electrodes are under formation. Therefore, the performance of the metal oxide IGZO-TFT is improved. However, this process requires an additional photolithography process to form the etching barrier layer, which is an extra process for manufacturing a metal oxide IGZO-TFT.

Since the manufacturing process of an etching barrier type TFT requires to etching a barrier layer and correspondingly requires a mask process for this layer, it complicates the whole manufacturing process, increases costs for products, decreases producing capacity and yield, and eventually lowers the profit of the product.

SUMMARY

At least one embodiment of the invention provides an array substrate manufacturing method, which is capable of simplifying the process of manufacturing etching barrier type TFT, lowering production cost, and increasing yield and product profit.

At least one embodiment of the invention provides an array substrate manufacturing method, comprising: forming an active layer of a thin film transistor, in which photoresist with a partial thickness at a location corresponding to a channel area between source/drain electrodes of the thin film transistor on the active layer is reserved; forming a source/drain metal layer, and further forming the source/drain electrodes; lifting off the photoresist with the partial thickness in the channel area between the source/drain electrodes.

In at least one embodiment of the invention, for example, forming of the active layer of a thin film transistor comprises: forming a layer of a semiconductor film, coating the photoresist on the semiconductor film, and employing a half tone mask to pattern the semiconductor film.

In at least one embodiment of the invention, for example, during patterning of the semiconductor film, after the photoresist is exposed and developed, a photoresist fully removed area, a photoresist partially reserved area and a photoresist fully reserved area are obtained. The photoresist fully reserved area corresponds to the channel area to be formed between the source/drain electrodes, the photoresist partially reserved area corresponds to the area covered by the source/drain electrodes on the active layer, and the photoresist fully removed area corresponds to the area outside the active layer. The semiconductor film in the photoresist fully removed area is removed by an etching process. The photoresist in photoresist partially reserved area is removed, and photoresist is reserved with the partial thickness in the photoresist fully reserved area.

In at least one embodiment of the invention, for example, forming of the source/drain electrodes comprises: forming a source/drain metal layer on the substrate on which the active layer has been formed, patterning the source/drain metal layer to form the channel area between the source/drain electrodes, and the removing photoresist with the partial thickness corresponding to the location of the channel area.

In at least one embodiment of the invention, for example, the manufacturing method further comprises forming a gate electrode and a gate insulating layer before the active layer is formed.

In at least one embodiment of the invention, for example, the manufacturing method further comprises forming a pixel electrode and a passivation layer after the source/drain electrode are formed.

BRIEF DESCRIPTION OF THE DRAWINGS

In order to clearly illustrate the technical solution of the embodiments of the invention, the drawings of the embodiments will be briefly described in the following; it is obvious that the drawings in the description are only related to some embodiments of the invention and thus are not limitative of the invention.

NUMERALS DESCRIPTION

Figure 1:
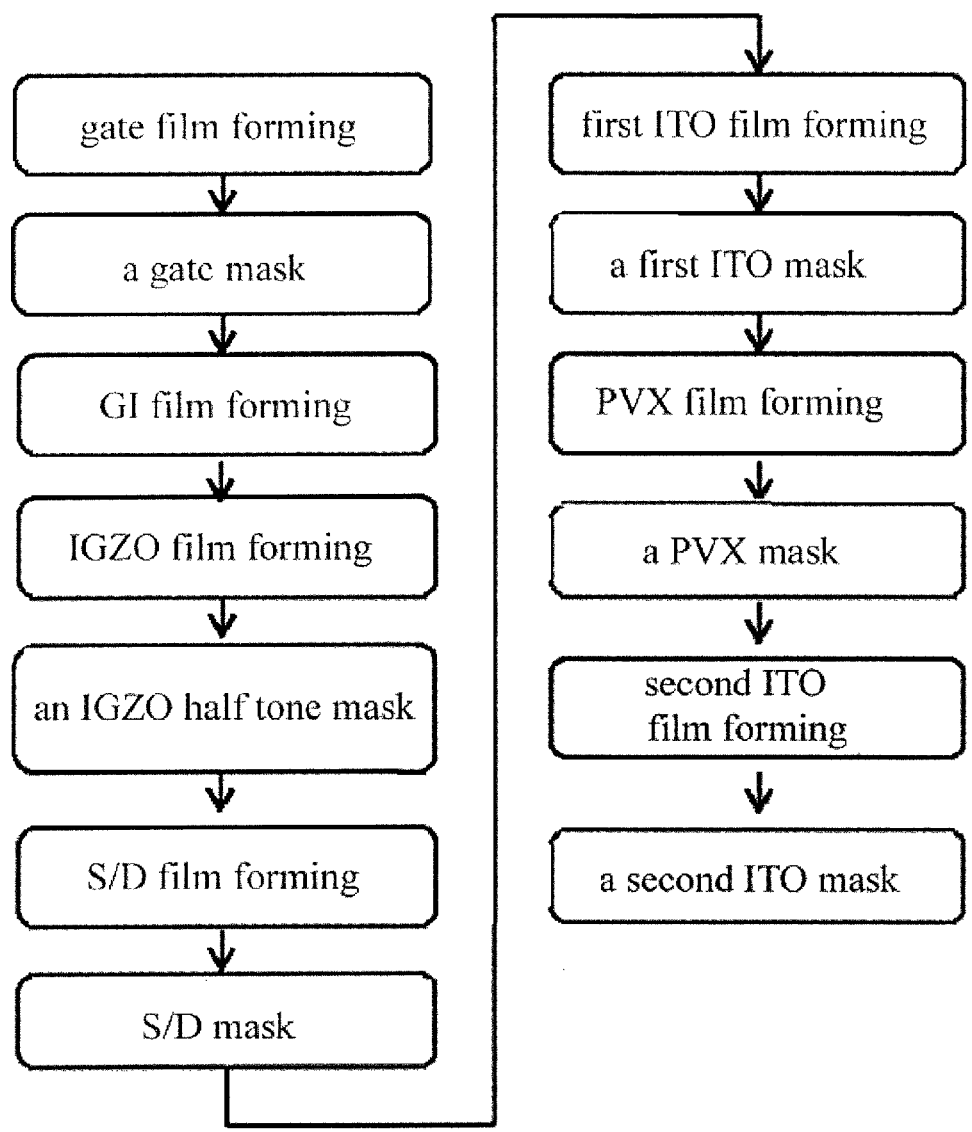
FIG. 1 is a process flow chart of one embodiment of the invention.

1: substrate; 2: gate line signal application area; 4: gate insulating layer; 5: active layer; 6: source/drain electrode; 7:

pixel electrode; 8: passivation layer; 9: common electrode; 10: data line signal application area; 11: photoresist.

DETAILED DESCRIPTION

In order to make purposes, technical details and advantages of the embodiments of the invention more apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), which fall within the scope of the invention, without any inventive work.

In order to simplify the process of manufacturing an etching barrier type TFT, lower produce cost, increase yield and product profit, at least one embodiment of the invention provides an improved array substrate manufacturing method.

At least one embodiment of the invention provides an array substrate comprising a plurality of gate lines and a plurality of data lines. The plurality of gate lines and the plurality of data lines intersect with each other to define pixel units arranged as an array. Each of the pixel units comprises a thin film transistor as a switch element, and comprises a pixel electrode and a common electrode for controlling the orientation of liquid crystal. For example, in each pixel, the gate electrode of the thin film transistor and the corresponding gate line may be electrically connected or formed as a whole, the source electrode and the corresponding data line may be electrically connected or formed as a whole, and the drain electrode and the corresponding pixel electrode may be electrically connected or formed as a whole. The following description mainly focuses on a signal pixel or a plurality of pixels, however other pixel units may be formed in the same way.

In the manufacturing method according to an embodiment of the invention, during the forming of an active layer of a thin film transistor, photoresist with a partial thickness at the location corresponding to a channel area between the source and drain electrodes of the thin film transistor on the active layer is reserved. Then a source/drain electrode layer is formed, and the source/drain electrodes are further formed. The photoresist with the partial thickness in the channel area between the source/drain electrodes is lift off.

The above technical solution is a manufacturing process using, for example, a partially-transparent mask (a half tone mask or a gray tone mask) technology to manufacture an etching barrier type metal oxide TFT. When a semiconductor film is under formation, a part of photoresist is reserved at a TFT channel by a partially-transparent mask process, so that a metal oxide layer is protected from being damaged in an etching process for source/drain electrodes. The photoresist is further lift off during s subsequent lifting-off process, and the photoresist may substitute a traditional etching barrier layer, so that both a film forming process and a mask process for the etching barrier may be saved, which lowers production costs, simplifies processes, and increases yield and product profit.

As shown in FIG. 1, at least one embodiment of the invention employs a method comprising 6 mask processes to manufacture an array substrate. The method is described in the following.

A step of forming a gate electrode (and a gate line) is performed, which mainly comprises a gate film forming process and a mask process.

Figure 2:
FIG. 2 is a schematic diagram of a substrate, after a gate electrode mask process is performed, in one embodiment of the invention.

First, a gate metal layer is formed on the substrate 1 for example of glass or plastic by a sputtering process. The gate metal layer may employ Cr, Mo, Al, Cu, or the like (a film forming process for the gate metal layer, i.e., a gate film forming process). Then, a gate mask is used to perform the first mask process, in which, a gate electrode 2 is formed by an exposure process, a development process and a wet etching process (a mask process for the gate metal layer, i.e., the gate mask process); the substrate structure shown in FIG. 2 is obtained.

In additional, a gate line signal application area 3 may be formed in the same layer with the gate electrode 2.

A step of forming a gate insulating layer (GI film forming) is performed, which mainly comprises a gate insulating layer film forming process.

For example, after the gate electrode 2 is formed, a SiO2 insulating thin film with a thickness of 2000 Å~5000 Å is formed as the gate insulating layer 4 by a plasma enhanced chemical vapor deposition (PECVD) method, to protect the gate electrode 2.

A step of forming an active layer is performed, which, for example, mainly comprises an IGZO film forming process and an IGZO half tone mask process.

Figure 3:
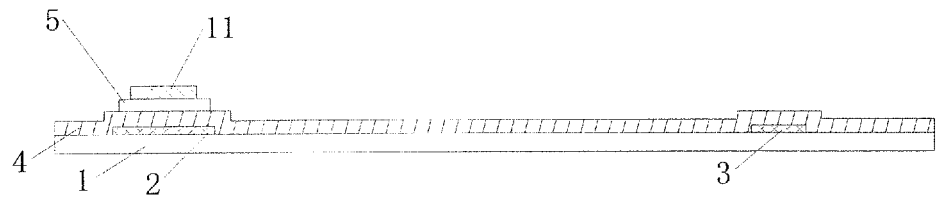
FIG. 3 is a schematic diagram of a substrate, after an IGZO partially-transparent mask process is performed, in one embodiment of the invention.

For example, on the gate insulating layer 4 formed above, a semiconductor film is formed by a sputtering process. The semiconductor film employs an IGZO metal oxide, for example ZnO, InZnO, ZnSnO, GaInZnO, or ZrInZnO. Then, a second mask process is performed, i.e., coating photoresist with a thickness of 200 Å~2000 Å and then patterning the semiconductor film by a half tone mask. During the procedure of patterning the semiconductor film, after the photoresist is exposed and developed, a photoresist fully removed area, a photoresist partially reserved area, and a photoresist fully reserved area are obtained. The photoresist fully reserved area corresponds to a channel area between source/drain electrodes to be formed, the photoresist partially reserved area corresponds to the area covered by the source/drain electrodes on the active layer 5, and the photoresist fully removed area corresponds to the area excluding the active layer 5. Then, the photoresist fully removed area of the semiconductor film is removed in the etching process. Next, for example, the photoresist in the photoresist partially reserved area and the photoresist fully reserved area is irradiated by ultraviolet rays with a certain light intensity, so that the photoresist in the photoresist partially reserved area is fully modified and developed to be removed, meanwhile the photoresist fully reserved area retains photoresist 11 with half of the thickness. The active layer 5 is obtained as shown in FIG. 3.

A step of forming a source/drain electrode is performed, which mainly comprises an S/D film forming process and an S/D mask process.

Figure 4:
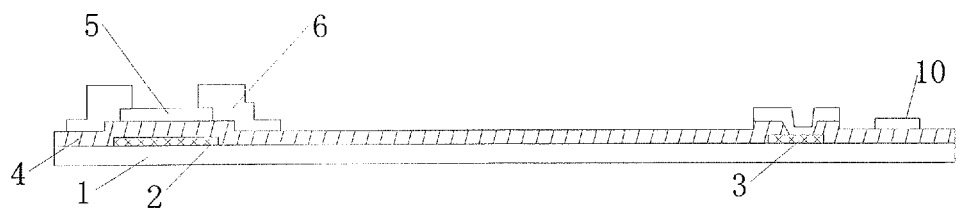
FIG. 4 is a schematic diagram of a substrate, after a source/drain & data line mask process is performed, in one embodiment of the invention.

For example, after the active layer 5 is formed, a source/drain (S/D) metal layer is formed on the substrate with a thickness of 1000 Å~6000 Å by a sputtering process. Then, a third mask process is performed to form a layer of photoresist on the S/D metal layer. The photoresist is exposed and developed with a source/drain electrode mask, so that the photoresist corresponding to the area of the source/drain electrodes to be formed is reserved, and the photoresist of other area is fully removed. The source/drain electrodes are formed by the etching process. At this time, the channel area between the source electrode and the drain electrode is obtained, while the portion of photoresist, which is previously reserved in the step of forming the active layer 5, is still reserved in the channel area. The photoresist on the source/drain electrodes and the photoresist 11 with a half thickness left on the active layer 5 are stripped together, forming the source/drain electrodes 6 as shown in FIG. 4.

In additional, for example, in the same layer where the source/drain electrodes 6 is formed, a data line signal application area 10 may be formed.

A step of forming a pixel electrode is performed, for example, which mainly comprises a first ITO film forming process and a first ITO mask process.

Figure 5:
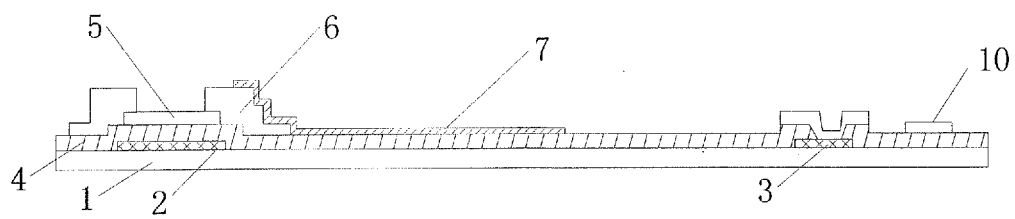
FIG. 5 is a schematic diagram of a substrate, after a pixel electrode mask process is performed, in one embodiment of the invention.

For example, a transparent electrode layer with a thickness of 100 Å~1000 Å is formed on the substrate where the source/drain electrodes 6 are formed. The transparent electrode layer may be formed of ITO or IZO, for example. Then, a fourth mask process is performed. Photoresist is formed on the transparent electrode. A pixel electrode mask is used to expose and develop the photoresist. After the etching process, the patterned transparent electrode is obtained. Then, the photoresist is stripped. The pixel electrode 7 is formed as shown in FIG. 5.

A step of forming a passivation layer is performed, which mainly comprises a passivation layer (PVX) film forming process and a PVX mask process.

Figure 6:
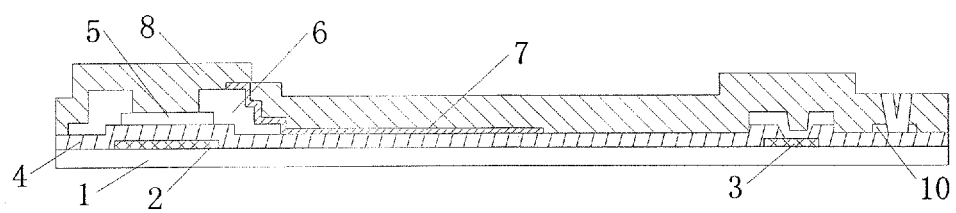
FIG. 6 is a schematic diagram of a substrate, after a protective layer mask process is performed, in one embodiment of the invention.

For example, on the substrate where the pixel electrode 7 is formed, a layer of passivation layer material with a thickness of 2000 Å~4000 Å is formed by chemical vapor deposition (CVD). The passivation layer material may employ a single film formed by SiOx, or a composition film formed by a composition of SiOx and SiNx. Then, a fifth mask process is performed. Photoresist is formed on a protective layer. A passivation layer mask is used to expose and develop the photoresist. After the etching process, the patterned passivation layer is obtained. Then, the photoresist is stripped. The passivation layer 8 is obtained as shown in FIG. 6.

If the common electrode is arranged on the substrate and the common electrode is located above the pixel electrode, a corresponding array substrate manufacturing method may also comprise the following steps to form the common electrode.

A step of forming the common electrode is performed, for example, which comprises a second ITO film forming process and a second ITO mask process.

Figure 7:
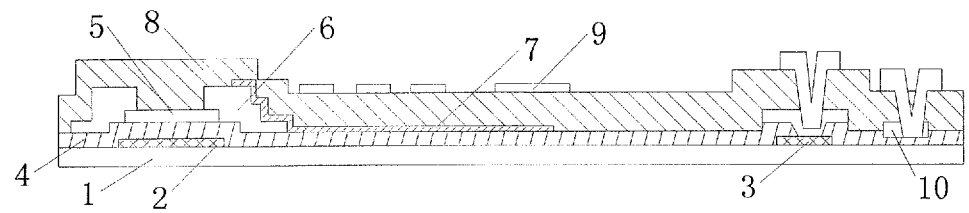
FIG. 7 is a schematic diagram of a substrate, after a common electrode mask process is performed, in one embodiment of the invention.

For example, a transparent electrode layer with a thickness of 100 Å~1000 Å is formed on the substrate where the passivation layer 8 is formed. The transparent electrode layer may be formed of ITO or IZO, for example. Then, a sixth mask process is performed. Photoresist is formed on the transparent electrode. A common electrode mask is used to expose and develop the photoresist. After the etching process, the patterned transparent electrode is obtained. Then, the photoresist is stripped. The common electrode 9 is obtained as shown in FIG. 7.

In the above processes, only the step of forming a gate insulating layer does not need to perform a mask process, the other 6 steps needs six mask processes in total. In the step of forming an active layer, for the IGZO half tone mask process on the array substrate, the photoresist is partially reserved at the TFT channel by the half tone mask process, to function as an etching barrier in the course when the source/drain electrodes layer is manufactured, in order to protect the IGZO metal oxide, which is used to form the active layer, from being etched. The partial photoresist will be removed in the subsequently lifting-off procedure. Thus, there is no need to add an etching barrier layer, and the mask process for the etching barrier layer is saved as well, which simplifies processes, lowers production costs, increases production capacity and yield, and eventually increases product profit.

The above-described manufacturing method involves an array substrate structure in which the common electrode is located above the pixel electrode, while for an array substrate structure in which the common electrode is located under the pixel electrode, the step of forming the active layer and the step of forming the source/drain electrodes that follows may employ the same processes, and the difference merely lies in that whether the common electrode is formed before or after the pixel electrode. The description of manufacturing the whole array substrate will be omitted herein.

From the above embodiments, compared with the solution employing an etching barrier layer that is specifically formed, the embodiments of the invention can avoid damaging the metal oxide layer in the process of forming the source/drain metal electrodes, glow discharging during the formation of the etching barrier layer, damaging the metal oxide layer in the plasma and dry etching manufacturing method, and increasing residual stress and defect states. The manufacturing method increases no manufacturing processes, and therefore equipments can be used without modification.

What are described above is related to the illustrative embodiments of the disclosure only and not limitative to the scope of the disclosure. The scopes of the disclosure are defined by the accompanying claims.

The application claims priority of Chinese Patent Application No. 201410331516.4 filed on Jul. 11, 2014, the disclosure of which is incorporated herein by reference in its entirety as part of the present application.

What is claimed is:

1. An array substrate manufacturing method, comprising:
forming an active layer of a thin film transistor, wherein photoresist with a partial thickness at a location corresponding to a channel area between source/drain electrodes of the thin film transistor on the active layer is reserved;
forming a source/drain metal layer, and further forming the source/drain electrodes; and
lifting off the photoresist with the partial thickness in the channel area between the source/drain electrodes,
wherein, forming of the active layer comprises:
forming a layer of a semiconductor film, coating the photoresist on the semiconductor film, and employing a half tone mask to pattern the semiconductor film;
wherein, during the patterning of the semiconductor film, after the photoresist is exposed and developed, a photoresist fully removed area, a photoresist partially reserved area and a photoresist fully reserved area are obtained, and
the photoresist fully reserved area corresponds to the channel area to be formed between the source/drain electrodes, the photoresist partially reserved area corresponds to an area to be covered by the source/drain electrodes on the active layer, and the photoresist fully removed area corresponds to an area outside the active layer;
the semiconductor film in the photoresist fully removed area is removed by an etching process; and
the photoresist in the photoresist partially reserved area is removed, and the photoresist is reserved with the partial thickness in the photoresist fully reserved area.

2. The array substrate manufacturing method according to claim 1, wherein, forming of the source/drain electrodes comprises:
forming a source/drain metal layer on the substrate on which the active layer has been formed, patterning the source/drain metal layer to form the channel area between the source/drain electrodes, and then removing the photoresist with the partial thickness corresponding to the location of the channel area.

3. The array substrate manufacturing method according to claim 1, further comprising forming a gate electrode and a gate insulating layer before the active layer is formed.

4. The array substrate manufacturing method according to claim 3, further comprising forming a pixel electrode and a passivation layer after the source/drain electrodes are formed.

5. The array substrate manufacturing method according to claim 1, wherein the active layer is formed of ZnO, InZnO, ZnSnO, GaInZnO, or ZrInZnO.

6. The array substrate manufacturing method according to claim 1, wherein a thickness of the formed source/drain metal layer is 1000 Å~6000 Å.

7. The array substrate manufacturing method according to claim 3, wherein the gate electrode is formed of Cr, Mo, Al, or Cu.

8. The array substrate manufacturing method according to claim 4, wherein the pixel electrode is formed of a transparent electrode with a thickness of 100 Å~1000 Å.

9. The array substrate manufacturing method according to claim 4, wherein the passivation layer is formed of a layer of SiOx or a composition of a SiOx layer and a SiNx layer.

10. The array substrate manufacturing method according to claim 1, wherein forming of the source/drain electrodes comprises:
forming a source/drain metal layer on the substrate on which the active layer has been formed, patterning the source/drain metal layer to form the channel area between the source/drain electrodes, and then removing the photoresist with the partial thickness corresponding to the location of the channel area.

11. The array substrate manufacturing method according to claim 10, further comprising forming a gate electrode and a gate insulating layer before the active layer is formed.

12. The array substrate manufacturing method according to claim 10, further comprising forming a pixel electrode and a passivation layer after the source/drain electrodes are formed.

13. The array substrate manufacturing method according to of claim 10, wherein the active layer is formed of ZnO, InZnO, ZnSnO, GaInZnO, or ZrInZnO.

14. The array substrate manufacturing method according to claim 10, wherein a thickness of the formed source/drain metal layer is 1000 Å~6000 Å.

15. The array substrate manufacturing method according to claim 11, wherein the gate electrode is formed of Cr, Mo, Al, or Cu.

16. The array substrate manufacturing method according to claim 12, wherein the pixel electrode is formed of a transparent electrode with a thickness of 100 Å~1000 Å.

17. An array substrate manufacturing method, comprising:
forming an active layer of a thin film transistor, wherein a photoresist with a partial thickness at a location corresponding to a channel area between source/drain electrodes of the thin film transistor on the active layer is reserved;
forming a source/drain metal layer, wherein a photoresist at a location corresponding to a source/drain area is reserved, and further forming the source/drain electrodes; and
lifting off from the formed source/drain electrodes the photoresist with the partial thickness in the channel area between the source/drain electrodes together with the photoresist corresponding to the source/drain area
wherein a thickness of the active layer is 200 Å~2000 Å, and
wherein a thickness of the formed source/drain metal layer is 1000 Å~6000 Å.

18. An array substrate manufacturing method, comprising:
forming an active layer of a thin film transistor, wherein a photoresist with a partial thickness at a location corresponding to a channel area between source/drain electrodes of the thin film transistor on the active layer is reserved;
forming a source/drain metal layer, wherein a photoresist at a location corresponding to a source/drain area is reserved, and further forming the source/drain electrodes; and
lifting off from the formed source/drain electrodes the photoresist with the partial thickness in the channel area between the source/drain electrodes together with the photoresist corresponding to the source/drain area,
wherein a thickness of the active layer is 400 Å~1500 Å, and
wherein a thickness of the formed source/drain metal layer is 2000 Å~5000 Å,
and wherein a gate electrode and a gate insulating layer are formed before the active layer.

* * * * *